(12) United States Patent
Riehl et al.

(10) Patent No.: US 10,877,072 B2
(45) Date of Patent: Dec. 29, 2020

(54) PLANAR DIFFERENTIAL CURRENT PICKUP FOR WIRELESS POWER TRANSMISSION

(71) Applicant: MediaTek Inc., Hsin-Chu (TW)

(72) Inventors: Patrick Stanley Riehl, Lynnfield, MA (US); Anand Satyamoorthy, Somerville, MA (US); Vladimir A. Muratov, San Jose, CA (US)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 16/847,576

(22) Filed: Apr. 13, 2020

(65) Prior Publication Data

US 2020/0241049 A1 Jul. 30, 2020

Related U.S. Application Data

(62) Division of application No. 15/139,792, filed on Apr. 27, 2016, now Pat. No. 10,656,185.

(60) Provisional application No. 62/193,794, filed on Jul. 17, 2015.

(51) Int. Cl.
*G01R 15/18* (2006.01)
*H02J 50/12* (2016.01)
*H01F 38/14* (2006.01)
*H02J 7/02* (2016.01)
*H02J 50/80* (2016.01)

(52) U.S. Cl.
CPC ........... *G01R 15/18* (2013.01); *G01R 15/181* (2013.01); *H01F 38/14* (2013.01); *H02J 50/12* (2016.02); *H02J 7/025* (2013.01); *H02J 50/80* (2016.02)

(58) Field of Classification Search
CPC .. G01R 1/203; G01R 15/146; G01R 19/0007; G01R 1/20; G01R 1/22; H02J 50/12
See application file for complete search history.

(56) References Cited

U.S. PATENT DOCUMENTS

| 9,958,480 | B2 | 5/2018 | Nejatali |
| 10,656,185 | B2 | 5/2020 | Riehl et al. |
| 2008/0084205 | A1* | 4/2008 | Zimmer ................... G01K 7/22 324/252 |
| 2013/0057267 | A1 | 3/2013 | Klein |
| 2014/0167704 | A1 | 6/2014 | Lafontaine et al. |
| 2015/0061645 | A1 | 3/2015 | Nemoto et al. |

(Continued)

FOREIGN PATENT DOCUMENTS

| CN | 101336378 A | 12/2008 |
| CN | 104422811 A | 3/2015 |

(Continued)

OTHER PUBLICATIONS

Extended European Search Report for European Application No. EP 16179123.1, dated Dec. 9, 2016.

*Primary Examiner* — Tung X Nguyen
(74) *Attorney, Agent, or Firm* — Wolf, Greenfield & Sacks, P.C.

(57) ABSTRACT

Apparatus and methods for sensing current carried by one or more planar conductors is described. A plurality of sensing coils may be fabricated adjacent to one or more planar, current-carrying conductors. The sensing coils may detect a magnetic field generated by time-varying current flowing through the one or more planar conductors. The sensing coils may be arranged to cancel uniform and linear-gradient magnetic fields.

17 Claims, 4 Drawing Sheets

(56) References Cited

U.S. PATENT DOCUMENTS

| | | | |
|---|---|---|---|
| 2015/0115945 A1* | 4/2015 | Bureau | G01N 27/9033 |
| | | | 324/242 |
| 2016/0131682 A1 | 5/2016 | Scholz et al. | |
| 2017/0016937 A1 | 1/2017 | Riehl et al. | |

FOREIGN PATENT DOCUMENTS

| | | | | |
|---|---|---|---|---|
| CN | 104422819 A | | 3/2015 | |
| DE | 102013106099 A1 | * | 12/2014 | G01R 15/181 |
| DE | 102013106099 A1 | | 12/2014 | |
| EP | 1977257 | | 10/2008 | |
| EP | 2846163 A1 | | 3/2015 | |
| WO | WO 2014/198601 A1 | | 12/2014 | |

\* cited by examiner

PLANAR DIFFERENTIAL CURRENT PICKUP FOR WIRELESS POWER TRANSMISSION

CROSS-REFERENCE TO RELATED APPLICATIONS

This application is a Divisional of U.S. application Ser. No. 15/139,792, titled "PLANAR DIFFERENTIAL CURRENT PICKUP FOR WIRELESS POWER TRANSMISSION," filed Apr. 27, 2016, which claims priority to U.S. provisional application Ser. No. 62/193,794, titled "Planar Differential Current Pickup for Wireless Power Transmission," filed Jul. 17, 2015, which is hereby incorporated by reference in its entirety.

BACKGROUND

1. Technical Field

The apparatus and techniques described herein relate generally to sensing current carried by one or more planar conductors.

2. Discussion of the Related Art

Wireless Power Transfer Systems (WPTS) are gaining increasing popularity as a convenient way to deliver power without wires or connectors. WPTS currently under development in the industry can be separated in two major classes: magnetic induction (MI) systems and magnetic resonance (MR) systems. Both types of systems include a transmitting unit, sometimes referred to as a power transmitting unit (PTU), and a receiving unit, sometimes referred to as a power receiving unit (PRU). Typically, the PTU is used to wirelessly charge mobile devices such as smartphones, portable music players, tablets, and laptops, among other devices and applications. The mobile devices may include a PRU.

Inductive WPTS typically operate in an allocated frequency range of about one hundred to several hundred kilohertz using frequency variation as a power flow control mechanism. MI WPTS operate over short ranges (typically limited to about the diameter of a power transmit coil). In a MI WPTS, the magnetic fields decay exponentially from the power transmit coil, and are not radiated from the coil.

Resonant WPTS typically operate on a single resonant frequency using a tuned receiving antenna network and input voltage regulation to regulate output power. In typical applications, MR WPTS operate at a frequency of 6.78 MHz. Because a tuned receiving antenna is used, appreciable power transfer can occur over distances larger than the diameter of the power transmit coil.

With the introduction of WPTS into commercial products, different methodologies for power transfer using MR and MI systems evolved. Several industry committees such as the Wireless Power Consortium (WPC) and the AirFuel Alliance (AFA) are working on developing international standards for consumer products based on wireless power transfer. The standards may include, for example, specifications on an amount of rectified current, voltage, and/or power generated at a PRU via the device's receiving coil and power rectification circuitry. Some standards may also place constraints on the uniformity of rectified current at a wireless receiver or on the uniformity of power transmitted by a wireless power transmitter.

SUMMARY

Apparatus and methods described herein relate to sensing a primary current carried by one or more planar conductors using planar sensing coils. A planar sensing coil (also termed "sensor") may comprise a plurality of windings distributed in the vicinity of the one or more planar conductors, and may be arranged to generate negligible current responsive to time-varying magnetic fields that are substantially uniform or have a substantially linear gradient across the sensor. A planar conductor may be part of an integrated circuit or a trace on a printed circuit board that carries a time-varying current and generates a time-varying magnetic field in its vicinity. In some implementations, a planar conductor may carry alternating current to a transmit coil that is used for wireless power transfer. The windings of a sensor may be fabricated adjacent to the one or more planar conductors and arranged to sense the time-varying magnetic field generated by the one or more planar conductors. The windings may generate a secondary current that is proportional to the primary current flowing in the one or more planar conductors.

Some embodiments relate to current sensors for a pair of conductors that carry an electrical current. A current sensor may comprise a first winding located on a first side of a first conductor of the pair of conductors, and a second winding located between the first conductor and a second conductor of the pair of conductors. The second conductor may be configured to carry the electrical current in a direction opposite to a flow of the electrical current in the first conductor. A current sensor may further comprise a third winding located on a first side of the second conductor.

In some embodiments, a current sensor may be arranged to sense current in a single, planar conductor and comprise a first planar winding having a first area and formed on a first side of the conductor. The sensor may further include a second planar winding having a second area approximately equal to the first area and formed on a second side of the conductor, and a conductive via connecting a first portion of the first planar winding located on a first conductive level to a second portion of the first planar winding located on a second conductive level.

Some embodiments relate to methods of sensing electrical current flowing in a pair of conductors. A method of sensing electrical current may comprise acts of generating a first current in a first winding located on a first side of a first conductor of the pair of conductors, and generating a second current in a second winding located between the first conductor and a second conductor of the pair of conductors. The second conductor may carry the electrical current in a direction opposite to a flow of the electrical current in the first conductor. A method of sensing electrical current may further comprise generating a third current in a third winding located on a first side of the second conductor.

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. Directional and orientation references made with respect to the drawings are for teaching purposes only, and are not meant to limit directions or configurations of the described apparatus. The drawings are not necessarily drawn to scale, with emphasis instead being placed on illustrating various aspects of the techniques and devices described herein.

DETAILED DESCRIPTION

Some circuit applications may require tight constraints on an amount and/or uniformity of power delivered to or transmitted from a component in a circuit. For example, constraints may be placed on an amount and/or uniformity of power or signal power transmitted by a wireless transmitter. For wireless power transmission, established standards (such as the AirFuel Resonant standard), may impose limits in terms of total power and/or uniformity of power transmitted by a wireless power transmitter. For example, a uniformity of transmitted power may be constrained to root-mean-square amplitude variations that do not exceed ±5% of the average output. Other applications may impose different constraints relating to power flowing within a circuit. For example, a limit on power or current may be imposed for heating or circuit-damage considerations in some cases.

Figure 1:
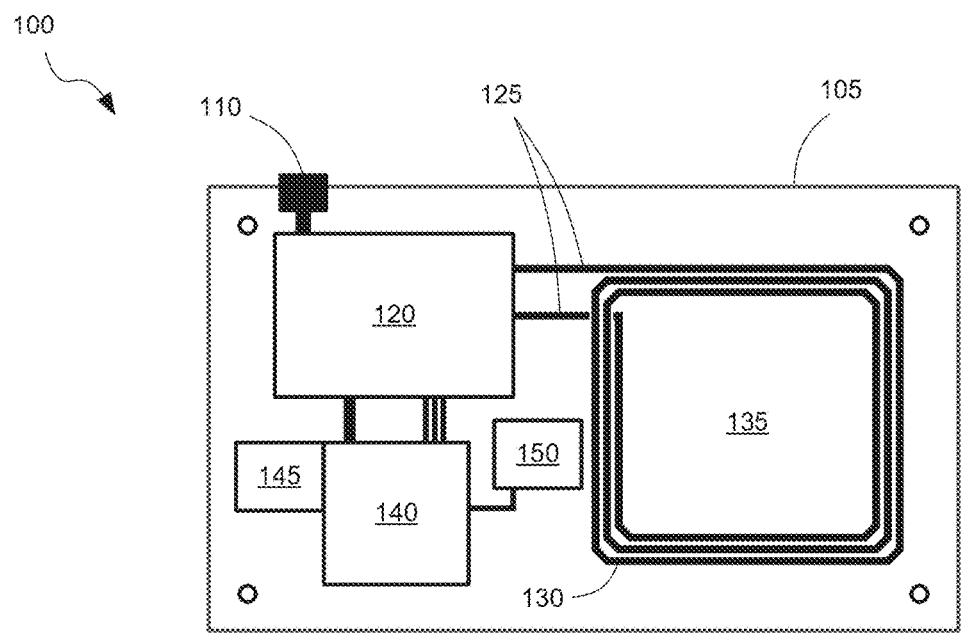
FIG. 1 depicts some components of a wireless power transmitter, according to some embodiments.

The inventors have recognized and appreciated that some circuits, such as wireless power transmission circuits or other planar fabricated circuits, may need active stabilization to control an amount power delivered to or transmitted from a circuit component. For example and referring to FIG. 1, active stabilization may be needed for power transmitted by a wireless power transmit coil 130 of a wireless power transmitter 100. The inventors have also recognized and appreciated that there can be a non-linear relationship between a drive amplitude of a current driver that supplies current to a circuit component (such as the power transmit coil 130) and an amount of current actually flowing into the load. Accordingly, the inventors have recognized and appreciated that it would be beneficial to sense an amount of current and/or power delivered into a load at or near the location of the load, for example, at one or more conductors delivering current to the load.

In some cases, an amount of current carried by a conductor may be too large to send through a resistive type sensor. In some implementations, a conventional current sensor may exhibit too much power loss or be too large and/or complicated for a particular application. Although some current sensors may be highly accurate, they may require advanced microfabrication techniques to implement and have an excessive cost for some applications.

Accordingly, the inventors have conceived of low-cost, planar, current-sensing coils that may be fabricated adjacent to one or more conductors and arranged to sense time-varying current flowing in the one or more conductors. The current-sensing coils may be configured to produce negligible current from background, time-varying magnetic fields that are substantially spatially uniform or have a substantially linear gradient. When a primary time-varying current flows through the one or more conductors, a time-varying magnetic field is generated in the vicinity of the one or more conductors. This time-varying magnetic field thereby induces a secondary current in a current-sensing coil which is proportional to an amount of primary current flowing in the one or more conductors. The secondary current can then be processed (e.g., rectified) and fed back to a driver that provides the primary current flowing in the one or more conductors.

Referring again to FIG. 1, an example of a wireless power transmitter 100 is depicted. A wireless power transmitter may be a low-profile electronic device that can be placed in any convenient location (e.g., on a desktop, table, countertop, night stand, in a vehicle, etc.) and wirelessly transmit power to a wireless power receiving device that is placed in close proximity (e.g., within about 50 mm) to the wireless power transmitter 100. According to some embodiments, a wireless power receiving device may provide a feedback signal to a wireless power transmitter 100 identifying whether more or less power is required at the receiving device.

According to some embodiments, a wireless power transmitter 100 may include a circuit board 105 that includes one or more electronic components of the wireless power transmitter, such as at least one power converter 120, a processor 140 or other control circuitry, and a transmit coil 130. A power converter 120 may convert power from a power source to produce an oscillating current that is applied to the transmit coil 130. In some embodiments, the power source may be an external source (e.g., a conventional residential or commercial AC line source, such as, but not limited to, 60 Hz, 100-127 VAC). Other examples of line power sources include 60 Hz, 220-240 VAC, 50 Hz, 100-127 VAC, and 50 Hz, 220-240 VAC. In some implementations, the power source may be a DC power source from a vehicle (e.g., automotive, railway, or airplane electrical system power). A power converter 120 may receive power through a power jack 110 and/or an extension cord that plugs into a conventional residential or commercial AC power outlet or a DC power outlet of a vehicle, for example. In some implementations, a wireless power transmitter may include a battery (not shown), which may be connected to the power converter and/or processor 140 to provide uninterruptible power. In some embodiments, a power converter 120 may include a switched-mode power supply and filtering circuitry configured to convert power from a power source to oscillating current that is applied to the transmit coil 130. The oscillating current may oscillate at a fixed frequency in compliance with wireless power transfer standards, or vary over a range of frequencies in compliance with other wireless power transfer standards. For example, the oscillating current may oscillate at approximately 6.78 MHz, though other frequencies may be used in some cases. In some embodiments, a power converter may include an inverter and one or more impedance-matching networks to facilitate power transfer between the power converter 120 and a power transmit coil 130.

A transmit coil 130 may comprise a conductive coil having a central open area 135. A power transmit coil 130 may have any suitable shape (e.g., square, rectangular, polygonal, circular, oval, etc.). The transmit coil may comprise one or multiple conductive windings, and may be connected to a power converter 120 via two conductors 125. The windings may be patterned as one or more conductive current loops. For example a winding may be formed from one or more conductive (copper) levels of a printed circuit board. For microscale wireless power applications, a winding (for signal transmission, for example) may be formed from one or more metallization levels of an integrated circuit. An oscillating current applied to the transmit coil of a wireless power transmitter 100 produces an oscillating magnetic field in the vicinity of the coil 130 that can extend through an enclosure of the wireless power transmitter, and have a highest value in a designated charging area (not shown) that is typically above or adjacent to the open area 135 of the transmit coil 130.

According to some embodiments, a wireless power transmitter 100 may include a power converter 120 and power transmit coil 130 configured for MR wireless power transfer. In some embodiments, a wireless power transmitter may include a power converter 120 and power transmit coil 130 configured for MI wireless power transfer.

According to some embodiments, a wireless power transmitter 100 may further include a processor 140 and a signal transceiver 150 that are in communication. The processor may comprise a microcontroller, microprocessor, digital signal processor (DSP), field programmable gate array (FPGA), analog circuitry, logic circuitry, or a combination thereof, by way of example. The processor 140 may be in communication with at least one memory device (not shown), which may store machine-readable instructions that can be executed by the processor to adapt the wireless power transmitter 100 to execute operations related to power transmission. The memory device may include RAM, ROM, flash memory, cached memory, or any other suitable memory. The processor 140 may also communicate with the power converter 120. For example, the processor may be connected to the power converter with one or more electrical connections through which power and data may be transferred. Processor 140 may manage control of the wireless power transmitter 100 by coordinating operation of, sending data to, and processing data from the power converter 120 and the transceiver 150.

In some embodiments, the transceiver 150 may comprise a radio-frequency (RF) transmitter for transmitting and receiving data signals to and from an external device (e.g., a device to be charged or powered by the wireless power transmitter). Transceiver 150 may be configured for Wi-Fi or Bluetooth communications, for example, though transceiver 150 is not limited to only these communication protocols. In some implementations, transceiver 150 may be configured for wired communications (e.g., via a universal serial bus). In some implementations, the transceiver may include separate transmitting and receiving chips or circuits. In some embodiments, the transceiver 150 may use a same magnetic coupling link that is used for wireless power transmission to send and receive data from a wireless power receiving device. Such communication processes may include, but are not limited to, "in-band communications," "load modulation," or "backscatter modulation". By communicating with a device to be charged, a feedback signal may be received from the device to be charged and used by the wireless power transmitter to adjust an amount of power transmitted by the transmit coil 130.

Figure 2:
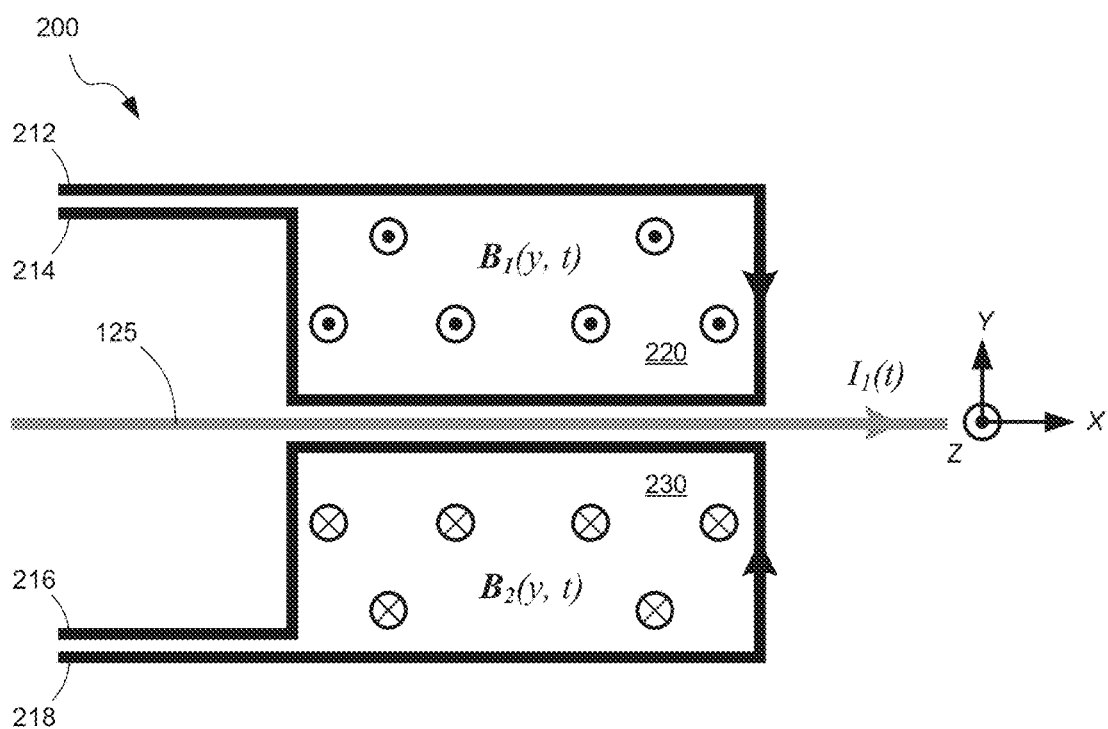
FIG. 2 illustrates a planar, dual-coil current sensor, according to some embodiments.

According to some embodiments, it may be beneficial to sense an amount of current flowing into the transmit coil 130 (or other load in other embodiments) over one or more conductors 125 connected to the load. FIG. 2 depicts one embodiment of a current-sensing coil 200 (also referred to as "current sensor" or "sensor") that may be used to sense current flowing through a conductor 125. The size of the current-sensing coil may be less than 10 millimeters by 10 millimeters, in some cases (for example, when used for sensing current delivered to power transmit coils). In some implementations, the size of the sensor may be as small as 10 microns by 10 microns (for example, when used for sensing current flowing through a conductor in an integrated circuit).

In some implementations, a current-sensing coil 200 may comprise a first winding 220 located of a first side of a conductor 125 and a second winding 230 located on a second side of the conductor 125. For the embodiment depicted in FIG. 2, the first winding, the conductor, and the second winding may all be coplanar and formed from a same conductive level on a printed circuit board or a same metallization level in an integrated circuit. The first winding may have a first lead 212 and a second lead 214 from which a first current may be detected (e.g., with a transimpedance amplifier). The second winding may have a first lead 216 and a second lead 218 from which a second current may be detected. In some embodiments, the first current and second current may be summed to produce a secondary current.

In some implementations, an area and shape of the first winding 220 may be approximately equal to an area and shape of the second winding 230. The windings may have any suitable shape, and need not be rectangular. The windings may be located approximately an equal distance from the conductor 125, but need not be located directly opposite each other. For example, one winding may be located upstream of the other winding, though it is preferable that the windings are in close proximity.

When in operation, time-varying current flowing through the conductor 125 may generate a time varying magnetic field $B_1$ and $B_2$ on either side of the conductor. The time varying magnetic field may decay radially from the conductor as depicted in the drawing. (The field also exists outside the windings, but has not been drawn to simplify the illustration.) In the plane of the coils, the magnetic field may decay in the ±y directions and be substantially uniform along the x direction. The magnitude of the magnetic field may be approximately equal on both sides of the conductor 125. As the time varying magnetic field changes through the first winding 220 and the second winding 230 it will induce a first current in the first winding that may be detected at the first lead 212 and the second lead 214. The magnetic field will also induce a second current in the second winding that may be detected at its first lead 216 and second lead 218.

According to some embodiments, differential detection may be used to process the currents from the two windings, though other processing techniques may be used in other embodiments. For example, the first lead 212 of the first winding may be applied to a first signal input of a differential amplifier and the first lead 216 of the second winding 230 may be applied to a second signal input of the differential amplifier. The second leads of the first and second windings may be grounded. In this manner, first current generated in the first winding and second current generated in the second winding will effectively be summed by the differential amplifier, since the currents flow in opposite directions in the windings. Further, noise common to both windings will be cancelled by the differential amplifier. Since the areas of the first winding 220 and the second winding 230 may be substantially equal, a time-varying uniform magnetic field that flows in the same direction through both windings would produce a common current signal in each winding that would effectively be canceled by the differential amplifier. If the current-sensing coil 200 occupies a small area (e.g., 1 cm² or less), it may reject a majority of background magnetic fields which may be approximately uniform over the area of the sensing coil, even though non-uniform over larger areas.

Figure 3:
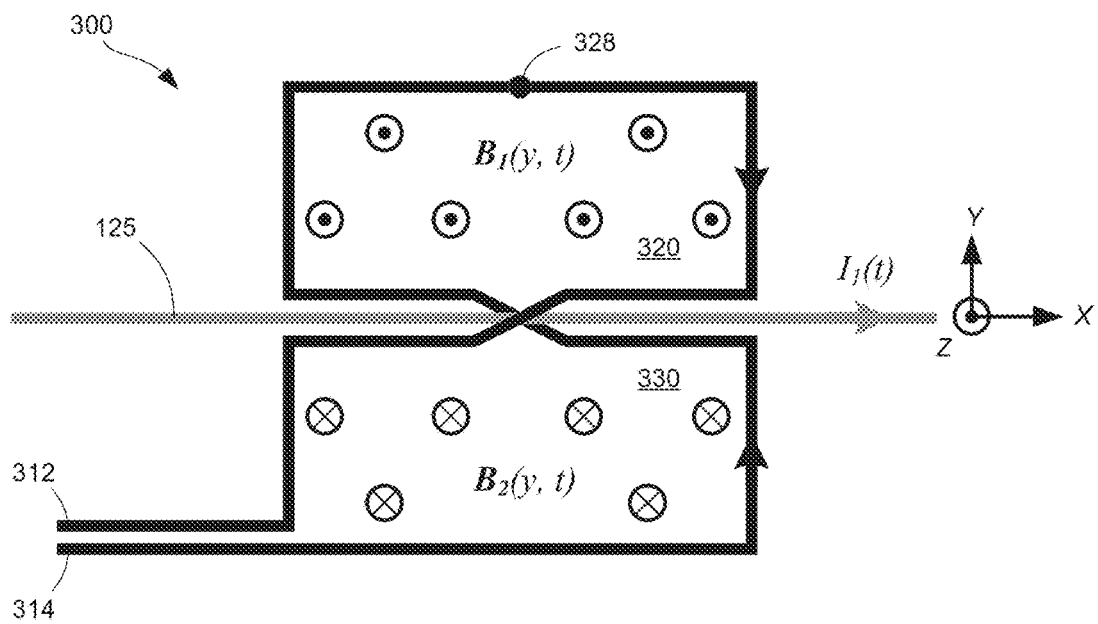
FIG. 3 depicts a multi-level, dual-coil current sensor, according to some embodiments.

FIG. 3 depicts an alternative embodiment of a current-sensing coil 300. In this embodiment, the first winding 320 and the second winding 330 are formed from a single conductive path, rather than two separate conductive paths. The single conductive path may be formed using two or more conductive levels of a printed circuit board or integrated circuit. For example, a first portion of the conductive path may proceed from the first lead 312, traverse the conductor 125, and continue to a conductive via 328. At the conductive via, the conductive path may proceed vertically to a second level, complete the first winding 320, traverse the conductor 125, and continue to the second lead 314. The conductor 125 may be patterned on a third level which may be above, between (as depicted), or below the first level and second level that are used to form the current sensor.

The areas and shapes of the first winding 320 and second winding 330 of the current-sensing coil 300 and their distances from the conductor 125 may be approximately equal, according to some embodiments. Because the winding directions are reversed, a uniform, time-varying magnetic field producing an essentially equal flux through both windings may produce negligible secondary current in the current-sensing coil 300. However, a magnetic field produced by time-varying current flowing through the conductor 125 will induce currents in each winding that are summed to provide a secondary current signal that can be detected at the coil's leads 312, 314.

Figure 4:
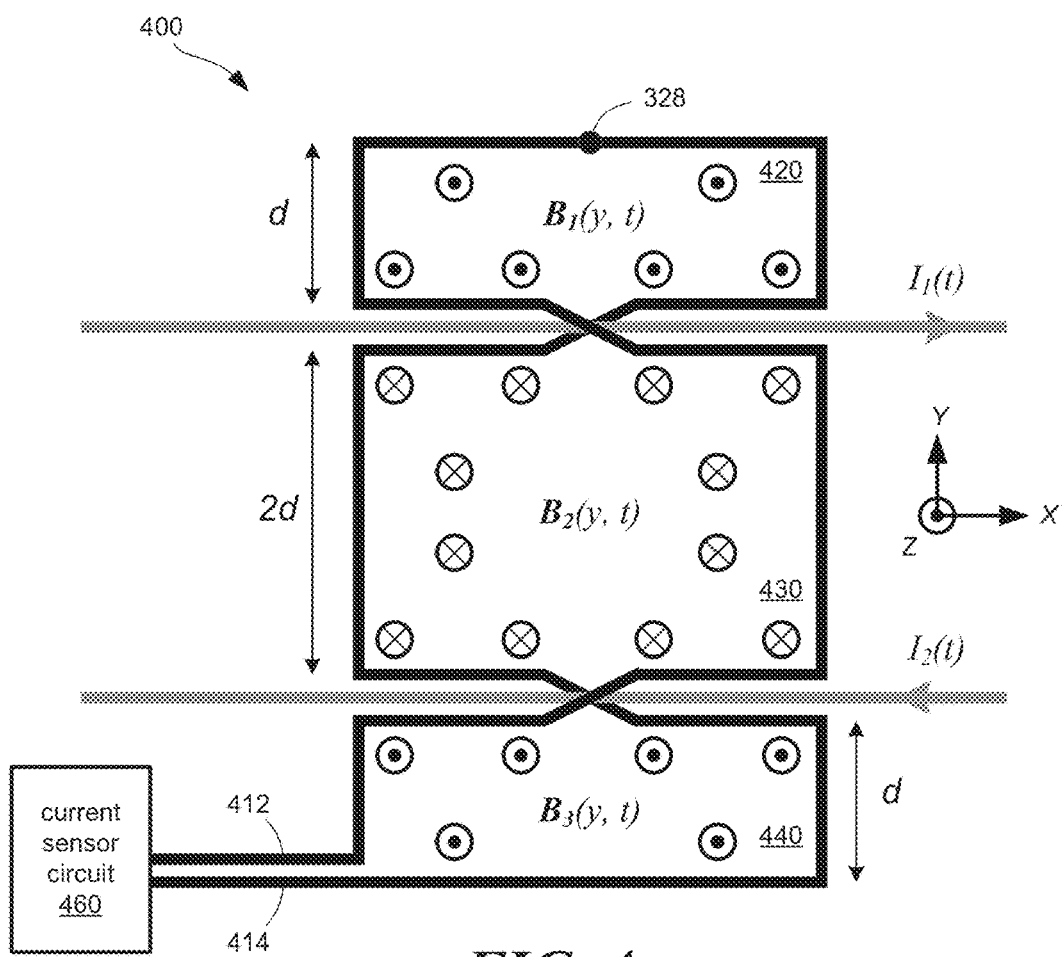
FIG. 4 depicts a multi-level, multi-coil current sensor, according to some embodiments.

Although FIG. 2 in FIG. 3 depict embodiments for sensing current on a single conductor 125, the accuracy of the sensors may be compromised if a second conductor carrying the same current is located near the conductor 125. For example and referring again to FIG. 1, conductors 125 may be spaced near each other and carry approximately the same amount of current to and from a power transmit coil 130. FIG. 4 depicts a current-sensing coil 400 that may be used to sense a current flowing in opposite directions through a pair of conductors 125, according to some embodiments.

A current sensor for a pair of conductors may comprise a first winding 420 located on a first side of a first conductor, a second winding 430 that is located between the two conductors, and a third winding 440 that is located on a side of the second conductor opposite the second winding. In some embodiments, the first winding, the second winding, and the third winding may be formed as separate windings, such as depicted in FIG. 2, so that the windings and conductors 125 may be patterned from a single level. In other embodiments, the windings may be formed as connected windings, as depicted in FIG. 4. According to some embodiments, an area of the second winding 430 may be approximately equal to the sum of the areas of the first and third windings 420, 440. The windings may have any suitable shape and be located so as to intercept approximately the same magnetic flux on either side of each conductor 125, according to some embodiments.

In some implementations, the first winding, the second winding, and the third winding may be formed as a single, continuous conductive path. For example, a first lead 412 of the current sensor may be patterned from a first conductive level. The conductive path may extend from the lead 412, traverse the pair of conductors 125, and extend to a conductive via 328 forming approximately one-half of each winding. At the conductive via, the conductive path may proceed vertically to a second level, where the conductive path traverses the two conductors 125 and extends to the second lead 414, completing the windings. The pair of conductors 125 may be patterned from a single level that may be above, between, or below the conductive levels from which the current-sensing coil 400 is formed.

When in operation, current flowing through the pair of conductors 125 will generate a time varying magnetic field as indicated in the drawing. The windings are configured (alternately reversed) such that a first current generated in the first winding 420 sums with a second current generated in the second winding 430 and additionally sums with a third current generated in the third winding 440 from the time varying magnetic fields $B_1$, $B_2$, and $B_3$.

The total secondary current produced by the sum of the first, second, and third currents may be detected with a current sensing circuit 460, which may comprise a transimpedance amplifier and rectifier that are arranged to produce an output voltage that is proportional to an amount of sensed current, according to some embodiments. In some embodiments, the produced voltage may be digitized, e.g., using an analog-to-digital converter. In some cases, an output from the current sensing circuit may be fed back to a power converter 120 and/or driver circuit for the power transmit coil 130, and used to adjust an amount of power or current delivered to the power transmit coil. In this manner, an amount of power transmitted from the transmit coil 130 may be stabilized. Although FIG. 3 and FIG. 4 depict coils having a single conductive via 328, additional conductive vias may be used in some embodiments. For example, a second conductive via may be used in the second winding 330 or third winding 440, so that the coil leads 312, 314 or 412, 414 may be on a same level.

Figure 5:
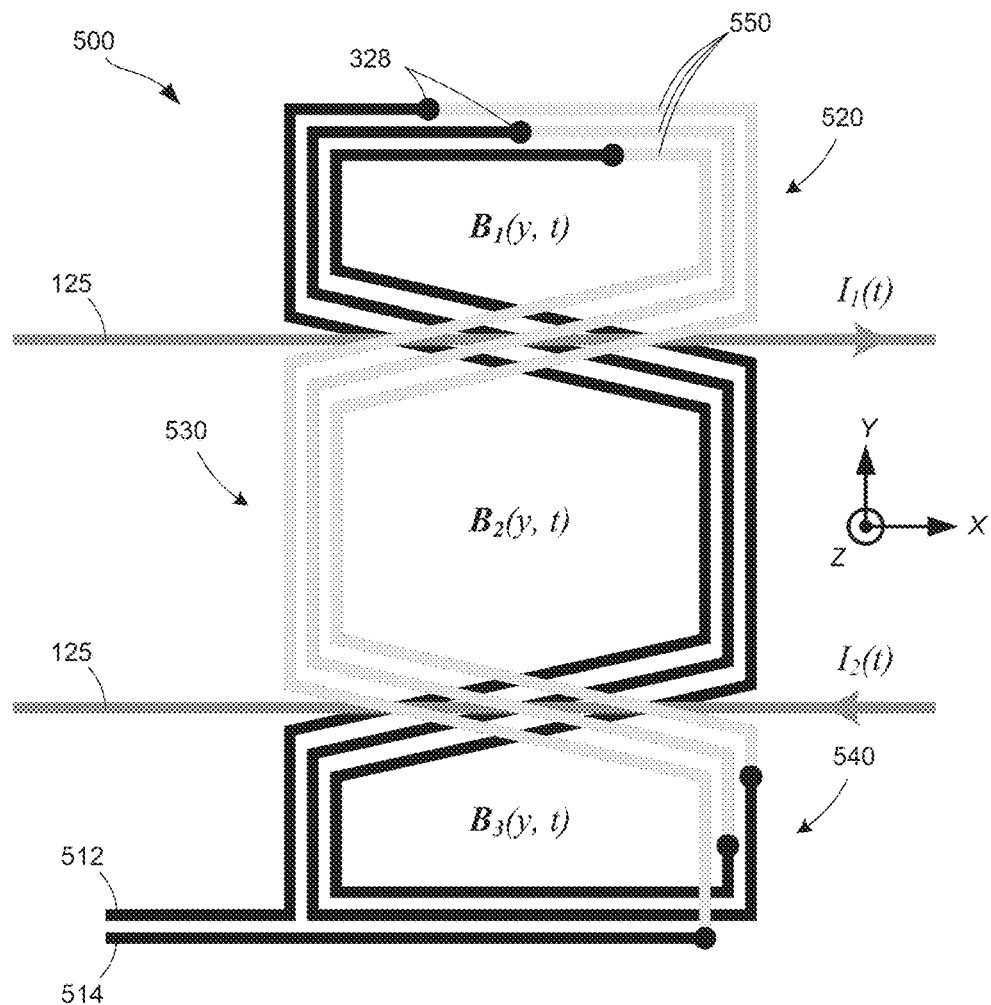
FIG. 5 depicts a multi-level, multi-coil current sensor for a pair of current-carrying conductors, according to some embodiments.

A multi-winding, current-sensing coil 500 is depicted in FIG. 5, according to some embodiments. This current sensor may be used to sense current flowing in a pair of conductors 125 and provide a stronger secondary current. A multi-winding sensor may comprise a plurality of first windings 520, a plurality of second windings 530, and a plurality of third windings 540. The first windings may be located on a first side of the first conductor, the second windings may be located between the two conductors 125, and the third windings may be located on a side of the second conductor opposite the second windings. The direction of the outer windings may be reversed from the direction of the second windings 530. According to some implementations, a total area of the first windings 520 summed with a total area of the third windings 540 may be approximately equal to a total area of the second windings 530. The windings may be shaped and located to intercept substantially the same flux on either side of each conductor 125. Multiple windings may be used to increase an amount of secondary current from the current sensor compared to single windings.

In some embodiments, a multi-winding, current-sensing coil 500 may be formed from a single, continuous conductive path, as depicted in FIG. 5. Portions of the conductive path may be formed on a first level and portions of the conductive path may be formed on a second level, though additional levels may be used in some implementations. For example, first portions (indicated by the black lines in the drawing) of a conductive path may be formed on a first conductive level (e.g., a first copper level of a PCB or a first metallization level of an integrated circuit). Second portions 550 (indicated by the light-shaded lines in the drawing) of the conductive path may be formed on a second conductive level. Conductive vias 328 may connect the conductive path between the first conductive level and the second conductive level. The pair of conductors 125 may run between, above, or below the levels on which the first portions and second portions of the conductive path are formed.

The sensors depicted in FIG. 4 and FIG. 5 may be arranged such that currents generated in each winding from the time varying magnetic fields $B_1$, $B_2$, and $B_3$ arising from current flow in the conductors 125 sum to produce a secondary current at the sensors leads 412, 414 or 512, 514. A current sensor 460 may be connected to the leads to detect the signal current.

Figure 6:
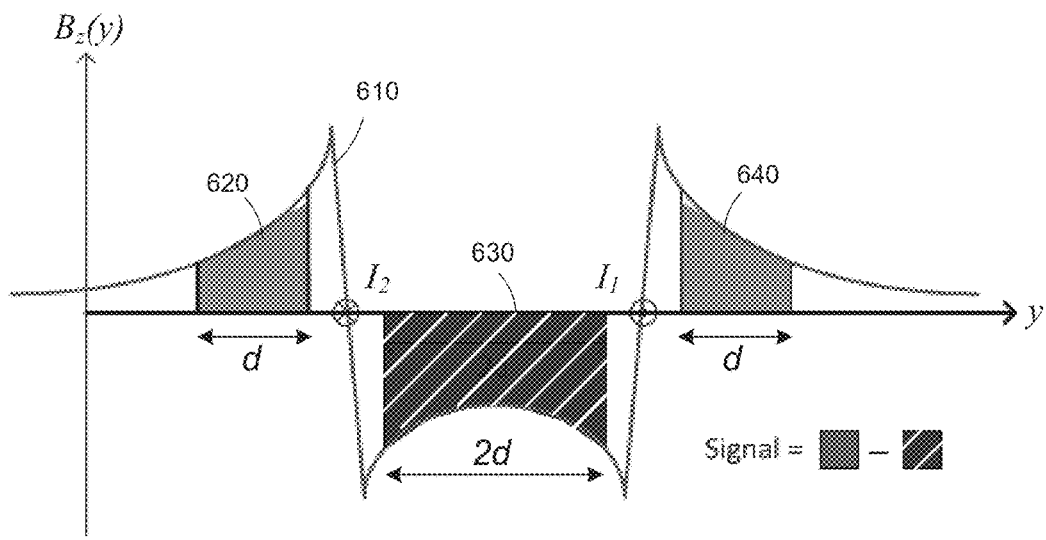
FIG. 6 illustrates magnetic fields in the vicinity of a pair of current-carrying conductors, according to some embodiments.

FIG. 6 graphically depicts how a signal may be produced from time-varying magnetic fields generated by current flowing in a pair of conductors 125. The graph in FIG. 6 represents a snapshot in time of a magnetic field profile 610 produced by currents $I_1$, $I_2$ flowing in a pair of conductors. For the depicted embodiment, $|I_2|=|I_1|$. The magnetic field is z directed and has an amplitude dependence as a function of y. At the snapshot in time, the amplitude of the magnetic field is positive to the left and right of the two conductors 125, and is negative between the two conductors. The first shaded area 620 corresponds to a magnetic flux flowing through the first winding 420 of the current sensor, for example. The second shaded area 630 corresponds to a magnetic flux flowing through the second winding 430, and the third shaded area 640 corresponds to magnetic flux flowing through the third winding 440. Because the direction of the second winding is reversed from the direction of the first and the third windings, the negative magnetic flux flowing through the second winding is subtracted from the positive magnetic flux flowing through the first and third windings, so that the three magnetic fluxes and resulting induced currents are effectively added by the current-sensing coil 400.

Figure 7:
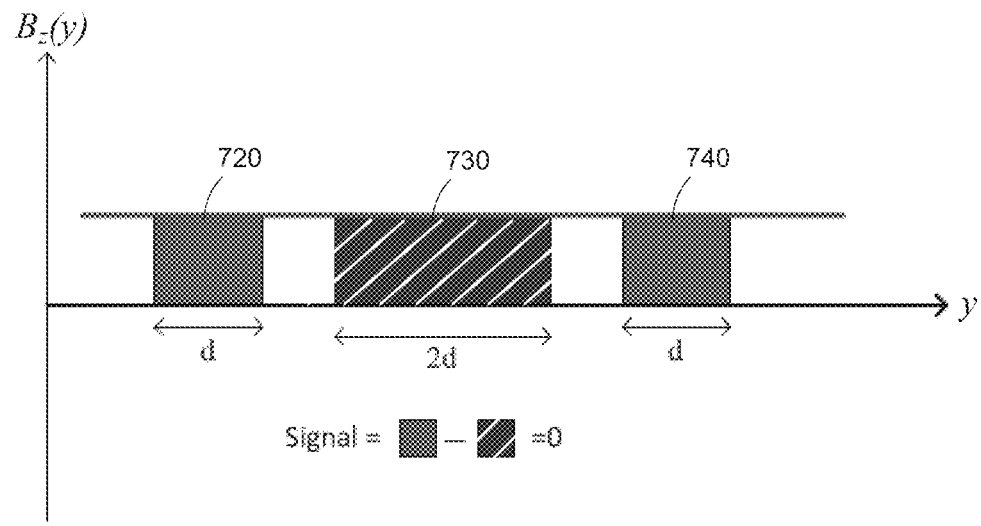
FIG. 7 illustrates cancellation of a uniform magnetic field for a multi-coil current sensor, according to some embodiments.

FIG. 7 graphically illustrates how a uniform magnetic field is essentially rejected by the current sensors of FIG. 4 and FIG. 5. When a uniform, time-varying magnetic field (such as one that may be produced by a power transmit coil 130 at the location of the conductors 125) flows through each of the windings in the same direction, it will produce negligible total secondary current in the sensor because the second winding is in a reverse direction from the first and third windings, provided that the sum of the areas of the first winding and third winding are approximately equal to the area of the second winding. As can be seen in FIG. 7, the total flux through the first and third windings (indicated by shaded areas 720, 740) are approximately equal to the flux through the second winding (indicated by shaded area 730). Because the second winding 430 is reversed from the first and third windings, the flux through the second winding is subtracted from the flux through the first and third windings. As a result, the net flux through the current-sensing coil 400 is essentially zero, and negligible secondary current is generated from the uniform magnetic field.

It should be noted that a "uniform" magnetic field will be cancelled if the magnetic field is only uniform in amplitude along the y direction. The amplitude of the magnetic field may have any profile along the x direction and still be rejected by the current-sensing coils shown in FIG. 4 and FIG. 5.

Figure 8:
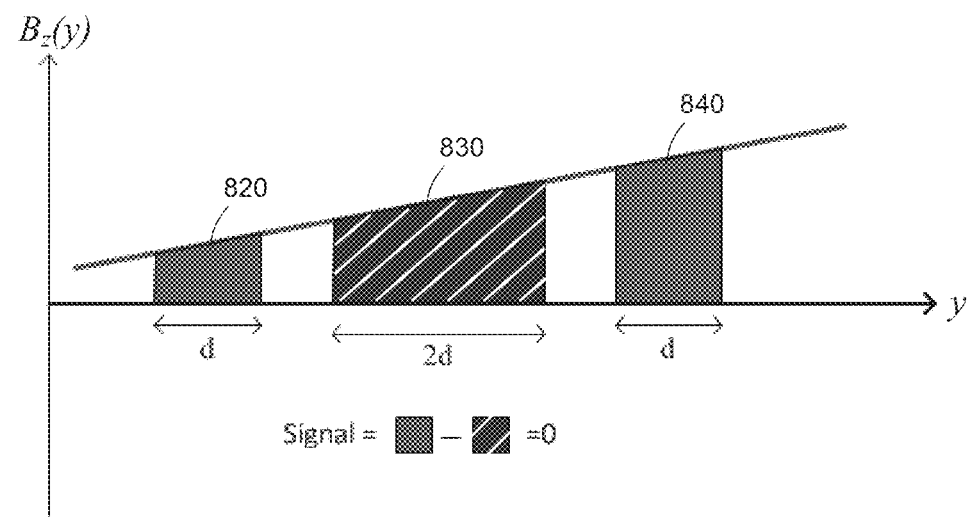
FIG. 8 illustrates cancellation of a linear-gradient magnetic field for a multi-coil current sensor, according to some embodiments.

The graph of FIG. 8 illustrates how a magnetic field with a linear gradient in amplitude will also produce negligible current through the current sensors of FIG. 4 and FIG. 5, provided the area of the first winding(s) summed with the area of the third winding(s) is approximately equal to the area of the second winding(s). It can be understood from the shaded areas 820, 830, 840 that represent an amount of magnetic flux through the respective first, second, and third winds that a net flux through the current-sensing coil will be zero. The net flux, and induced secondary current in the coil, will be negligible for a linear gradient along the y direction, even though the amplitude of the magnetic field may take on any profile along the x direction.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items. For example, an apparatus, structure, device, layer, or region recited as "including," "comprising," or "having," "containing," "involving," a particular material is meant to encompass at least the material listed and any other elements or materials that may be present.

What is claimed is:

1. A method for sensing an electrical current flowing in a pair of conductors, the method comprising:
    magnetically inducing a first current in a first winding located on a first side of a first conductor of the pair of conductors;
    magnetically inducing a second current in a second winding located between the first conductor and a second conductor of the pair of conductors, wherein the second conductor carries the electrical current in a direction opposite to a flow of the electrical current in the first conductor;
    magnetically inducing a third current in a third winding located on a first side of the second conductor; and
    summing the first current, the second current, and the third current to obtain a signal current that is proportional to the electrical current flowing in the pair of conductors.

2. The method of claim 1, wherein an area of the second winding is approximately equal to a sum of an area of the first winding and an area of the third winding.

3. The method of claim 1, wherein the pair of conductors, the first winding, the second winding, and the third winding are planar.

4. The method of claim 3, further comprising:
    conveying the electrical current through the pair of conductors using a first conductive level; and
    conveying the induced currents through the first winding, the second winding, and the third winding using at least one additional conductive level.

5. The method of claim 1, further comprising driving a wireless power transmit coil with the electrical current.

6. The method of claim 5, further comprising adjusting an amplitude of the electrical current based upon a value determined from a sum of the first current, the second current, and the third current.

7. A method for sensing an electrical current flowing in a pair of conductors, the method comprising:
- magnetically inducing a first current in a first winding located on a first side of a first conductor of the pair of conductors;
- magnetically inducing a second current in a second winding located between the first conductor and a second conductor of the pair of conductors, wherein the second conductor carries the electrical current in a direction opposite to a flow of the electrical current in the first conductor;
- magnetically inducing a third current in a third winding located on a first side of the second conductor;
- driving a wireless power transmit coil with the electrical current; and
- adjusting an amplitude of the electrical current based upon a value determined from a sum of the first current, the second current, and the third current.

8. The method of claim 7, wherein an area of the second winding is approximately equal to a sum of an area of the first winding and an area of the third winding.

9. The method of claim 7, wherein the pair of conductors, the first winding, the second winding, and the third winding are planar.

10. The method of claim 7, further comprising:
- conveying the electrical current through the pair of conductors using a first conductive level; and
- conveying the induced currents through the first winding, the second winding, and the third winding using at least one additional conductive level.

11. A method for sensing an electrical current flowing in a pair of conductors, the method comprising:
- magnetically inducing a first current in a first winding located on a first side of a first conductor of the pair of conductors;
- magnetically inducing a second current in a second winding located between the first conductor and a second conductor of the pair of conductors, wherein the second conductor carries the electrical current in a direction opposite to a flow of the electrical current in the first conductor; and
- magnetically inducing a third current in a third winding located on a first side of the second conductor, wherein the first winding, the second winding, and the third winding are connected in series.

12. The method of claim 11, further comprising summing the first current, the second current, and the third current to obtain a signal current that is proportional to the electrical current flowing in the pair of conductors.

13. The method of claim 11, wherein an area of the second winding is approximately equal to a sum of an area of the first winding and an area of the third winding.

14. The method of claim 11, wherein the pair of conductors, the first winding, the second winding, and the third winding are planar.

15. The method of claim 11, further comprising:
- conveying the electrical current through the pair of conductors using a first conductive level; and
- conveying the induced currents through the first winding, the second winding, and the third winding using at least one additional conductive level.

16. The method of claim 11, further comprising driving a wireless power transmit coil with the electrical current.

17. The method of claim 16, further comprising adjusting an amplitude of the electrical current based upon a value determined from a sum of the first current, the second current, and the third current.

* * * * *